US008829550B2

(12) United States Patent
Cho et al.

(10) Patent No.: US 8,829,550 B2
(45) Date of Patent: Sep. 9, 2014

(54) LIGHT EMITTING DIODE PACKAGE AND DISPLAY APPARATUS HAVING THE SAME

(71) Applicant: Samsung Display Co., Ltd., Yongin (KR)

(72) Inventors: Chi-O Cho, Asan-si (KR); Jae-Hyun Kim, Seoul (KR); Donghwan Kim, Seoul (KR); JungKyun Kim, Seoul (KR); Insun Hwang, Suwon-si (KR)

(73) Assignee: Samsung Display Co., Ltd. (KR)

( * ) Notice: Subject to any disclaimer, the term of this patent is extended or adjusted under 35 U.S.C. 154(b) by 97 days.

(21) Appl. No.: 13/742,151

(22) Filed: Jan. 15, 2013

(65) Prior Publication Data

US 2014/0027797 A1    Jan. 30, 2014

(30) Foreign Application Priority Data

Jul. 24, 2012   (KR) .......................... 10-2012-0080628

(51) Int. Cl.
*H01L 33/44*   (2010.01)
*H01L 33/50*   (2010.01)
*H01L 33/48*   (2010.01)
*H01L 33/08*   (2010.01)

(52) U.S. Cl.
CPC ............... *H01L 33/48* (2013.01); *H01L 33/501* (2013.01); *H01L 33/08* (2013.01); *H01L 33/502* (2013.01)
USPC .......................................................... 257/98

(58) Field of Classification Search
None
See application file for complete search history.

(56) References Cited

U.S. PATENT DOCUMENTS

| 7,829,413 | B2 | 11/2010 | Kim |
| 7,883,641 | B2 | 2/2011 | Isobe et al. |
| 8,071,181 | B2 | 12/2011 | Hegmann et al. |
| 2003/0015428 | A1* | 1/2003 | Becker et al. .................. 204/547 |
| 2004/0028869 | A1* | 2/2004 | Terao et al. ................... 428/64.4 |
| 2010/0019211 | A1 | 1/2010 | Yi et al. |
| 2010/0084629 | A1 | 4/2010 | Park et al. |
| 2010/0254911 | A1 | 10/2010 | Sharma et al. |
| 2011/0126889 | A1* | 6/2011 | Bourke et al. ................. 136/253 |
| 2011/0269297 | A1 | 11/2011 | Novichkov et al. |

(Continued)

FOREIGN PATENT DOCUMENTS

| JP | 2006-259032 | 5/2007 |
| KR | 10-2008-0030381 A | 10/2009 |
| KR | 10-2010-0085918 A | 3/2012 |

OTHER PUBLICATIONS

Lakowicz, Joseph, et. al., "Plasmon-controlled Fluorescence: A new detection technology", Plasmonics in Biology and Medicine III, edited by Tuan Vo-Dinh, Proceedings of SPIE vol. 6099, 609909, (2006).*

(Continued)

*Primary Examiner* — Thomas L Dickey
*Assistant Examiner* — Joseph Schoenholtz
(74) *Attorney, Agent, or Firm* — Innovation Counsel LLP

(57) ABSTRACT

A light emitting diode package includes a light emitting diode that emits a first light, a fluorescent substance that absorbs the first light and generates a second light having a wavelength different from the first light, and at least one core-shell particle disposed on a surface of the fluorescent substance. The core-shell particle includes a metal particle and an insulating layer coated on a surface of the metal particle. The core-shell particle receives at least one light component of the first light and the second light to induce a surface plasmon resonance.

20 Claims, 7 Drawing Sheets

(56) References Cited

U.S. PATENT DOCUMENTS

| | | | |
|---|---|---|---|
| 2011/0319601 A1* | 12/2011 | Anderson et al. | 530/391.1 |
| 2012/0049100 A1* | 3/2012 | Yonetsu et al. | 252/62.54 |
| 2012/0063276 A1* | 3/2012 | Reches et al. | 369/13.02 |
| 2012/0200218 A1* | 8/2012 | Maemura et al. | 313/483 |
| 2012/0263793 A1* | 10/2012 | Vitaliano | 424/490 |
| 2013/0039848 A1* | 2/2013 | Bradbury et al. | 424/1.37 |
| 2013/0221400 A1* | 8/2013 | Tanikawa et al. | 257/99 |
| 2013/0255778 A1* | 10/2013 | Okaniwa et al. | 136/259 |
| 2013/0257639 A1* | 10/2013 | Takahashi et al. | 342/1 |
| 2013/0299863 A1* | 11/2013 | Chu et al. | 257/98 |
| 2013/0313595 A1* | 11/2013 | Naasani et al. | 257/98 |

OTHER PUBLICATIONS

Sheng Peng et al., "Reversing the size-dependence of surface Plasmon resonances", Applied physical Sciences, Vo. 107, No. 33, pp. 14530-14534, Aug. 17, 2010.

Seong Min Lee et al., "Localized surface Plasmon enhanced cathodoluminescence from Eu3+-doped phosphor near the nanoscaled silver particles", Optics Express, vol. 19, No. 14, pp. 13209-13217, Jul. 4, 2011.

* cited by examiner

LIGHT EMITTING DIODE PACKAGE AND DISPLAY APPARATUS HAVING THE SAME

CROSS-REFERENCE TO RELATED APPLICATION

This U.S. non-provisional patent application claims priority under 35 U.S.C. §119 of Korean Patent Application No. 10-2012-0080628, filed on Jul. 24, 2012, the contents of which are hereby incorporated by reference.

BACKGROUND

1. Field of Disclosure

The present disclosure relates to a light emitting diode (LED) package and a display apparatus having the same. More particularly, the present disclosure relates to an LED package capable of controlling a wavelength of light generated by using a fluorescent substance, and a display apparatus having the LED package as its light source.

2. Description of the Related Art

Recently, LED packages, which include a light emitting diode, have been employed as light sources in display apparatuses. The light emitting diode is operated at a low voltage and generates light that is much brighter than the light generated from cold cathode fluorescent lamps. Accordingly, such LED packages are widely used not only as the light source for display apparatuses, but also as a light source in conventional light fixtures.

The color of the light emitted from the LED package can be controlled by combining light emitting diodes that emit different colors. However, when different colored light emitting diodes are combined in an LED package, the driving circuit of the LED package, which is provided to drive the light emitting diodes, becomes complex. Accordingly, it is difficult to miniaturize an LED package while combining differently colored light emitting diodes. Therefore, a fluorescent substance is typically employed to the LED package as an alternative method for controlling the color of the light emitted from the LED package.

The fluorescent substance receives the light from the light emitting diodes and changes a wavelength of the light received from the light emitting diodes. Therefore, the color of the light emitted from the LED package is controlled by the color of the light emitted from the light emitting diode and the color of the light emitted from the fluorescent substance. As a result, the emission of the LED package is influenced by the light emitting efficiency and reliability of the fluorescent substance that are used.

SUMMARY

An LED package having improved light emitting efficiency is provided.

A display apparatus having the LED package is also provided.

A light emitting diode package includes a light emitting diode that emits a first light, a fluorescent substance that absorbs the first light and generates a second light having a wavelength different from the first light, and at least one core-shell particle disposed on a surface of the fluorescent substance.

The core-shell particle includes a metal particle and an insulating layer coated on a surface of the metal particle. The core-shell particle receives at least one light component of the first light and the second light to induce a surface plasmon resonance.

A display apparatus includes a display panel that receives a light to display an image and a light emitting diode package that generates the light. The light includes a first light generated by the light emitting diode package and a second light generated by the light emitting diode package.

The light emitting diode package includes a light emitting diode that generates the first light, a fluorescent substance that absorbs the first light and generates the second light having a wavelength different from the first light, and at least one core-shell particle disposed on a surface of the fluorescent substance. The core-shell particle includes a metal particle and an insulating layer coated on a surface of the metal particle. The core-shell particle receives at least one light component of the first light and the second light to induce a surface plasmon resonance.

The display panel is a liquid crystal display panel.

In another aspect the display panel is an electrowetting display panel.

According to the above, because the core-shell particles are disposed or coated on the surface of the fluorescent layer, the surface plasmon resonance is induced by the metal particle of each core-shell particle and the light emitting efficiency of the fluorescent substance may be improved by a localized electric field generated by the surface plasmon resonance.

In addition, when the core-shell particles are disposed or coated on the surface of the fluorescent layer, the lights generated by the light emitting diode and the fluorescent substance are scattered by the metal particle of each core-shell particle. Thus, the frequency that the incident angle obtained when the scattered light is incident into the metal particle satisfies the surface plasmon resonance angle that causes the surface plasmon resonance is increased, accordingly, the surface plasmon resonance is more effectively activated and the light emitting efficiency of the fluorescent substance may be more improved.

Further, because the core-shell particles are placed or coated on the surface of the fluorescent substance, the fluorescent substance may be prevented from being directly exposed to external environments, e.g., moisture, temperature, etc. Therefore, deterioration of the fluorescent substance, which is caused by the external environment, may be reduced, and thus the light emitting function of the fluorescent substance, e.g., life-span, color purity, etc., may be improved.

BRIEF DESCRIPTION OF THE DRAWINGS

The above and other advantages will become readily apparent by reference to the following detailed description when considered in conjunction with the accompanying drawings wherein.

DETAILED DESCRIPTION

Figure 1:
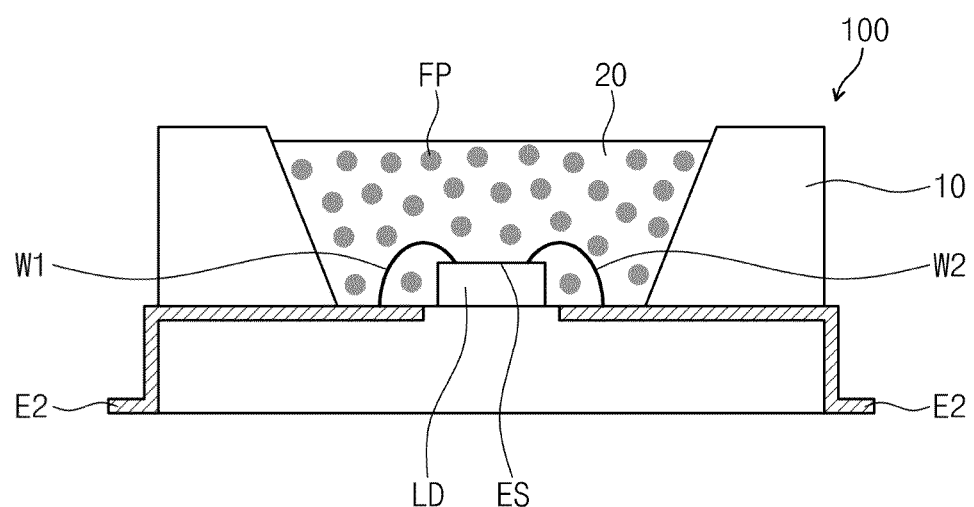
FIG. 1 is a cross-sectional view showing an LED package according to an exemplary embodiment.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below, depending on the actual orientation of the device. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Figure 2:
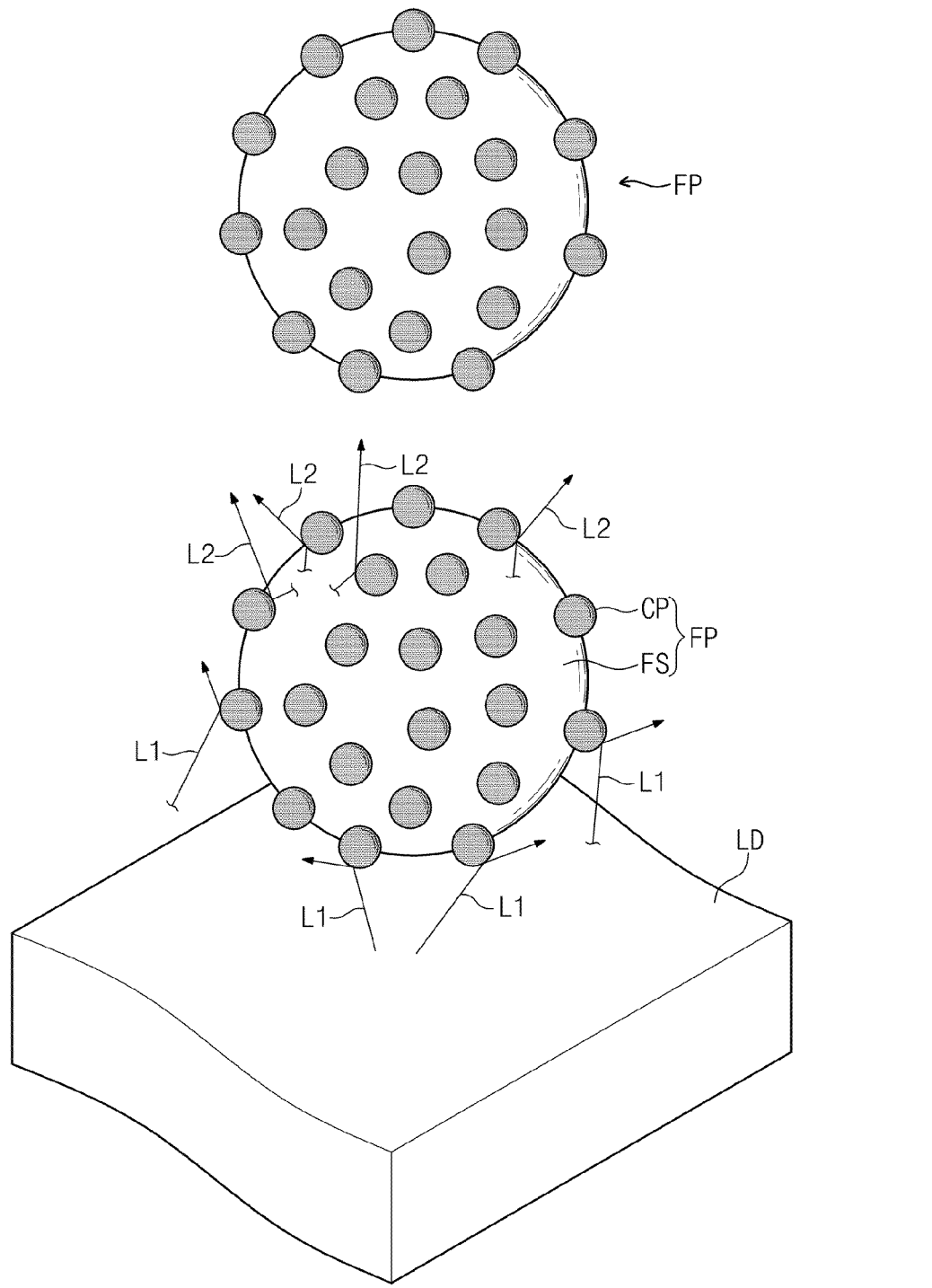
FIG. 2 is an enlarged view showing optical particles shown in FIG. 1.
Figure 3:
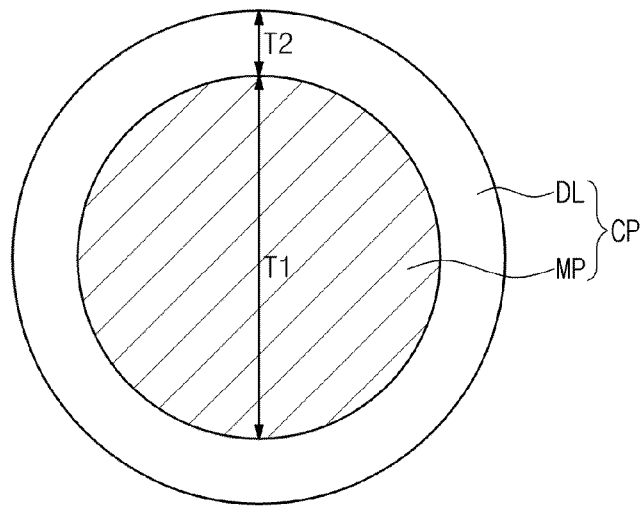
FIG. 3 is a cross-sectional view showing a core-shell particle shown in FIG. 2.

FIG. 1 is a cross-sectional view showing an LED package according to an exemplary embodiment, FIG. 2 is an enlarged view showing optical particles shown in FIG. 1, and FIG. 3 is a cross-sectional view showing a core-shell particle shown in FIG. 2.

Referring to FIGS. 1 to 3, an LED package 100 includes a mold 10, a light emitting diode LD, a protective layer 20, a first electrical terminal E1, a second electrical terminal E2, a first electrode wire W1, a second electrode wire W2, and a plurality of optical particles FP. Each of the optical particles FP include a fluorescent substance FS and a plurality of core-shell particles CP.

The mold 10 provides a receiving space to accommodate the light emitting diode LD, and an upper portion of the mold 10 is open. In the present exemplary embodiment, the mold 10 may include an insulating material. For instance, the mold 10 includes a plastic material such as polyphthalamide (PPA).

The light emitting diode LD is accommodated in the receiving space of the mold 10 to generate a first light L1, and the first light L1 exits through a light emitting surface ES of the light emitting diode LD. The light emitting diode LD is, for example, a p-n junction semiconductor material and emits energy generated by a recombination of holes and electrons at the p-n junction as the first light L1. In the present exemplary embodiment, the semiconductor material includes for example, oxide semiconductors, and materials such as, for example, gallium arsenide (GaAs), gallium phosphide (GaP), indium phophide (InP), etc.

The protective layer 20 includes an insulating material and fills the receiving space of the mold 10 to cover the light emitting diode LD. The insulating material may be, but not limited to, a material having that transmits light, such as a silicon resin or an epoxy resin. In this case, the first light L1 emitted from the light emitting diode LD transmits through the protective layer 20 to travel the outside of the mold 10 or to be provided to the optical particles FP.

The first electrical terminal E1 and the second electrical terminal E2 each include a conductive material. The first electrical terminal E1 is connected to a positive (+) terminal of the light emitting diode LD, and the second electrical terminal E2 is connected to a negative (−) terminal of the light emitting diode LD. In the present exemplary embodiment, a first end portion of each of the first and second electrical terminals E1 and E2 is located inside the receiving space of the mold 10, and a second end portions of the first and second electrical terminals E1 and E2 extends outside the mold 10.

The first electrode wire W1 is electrically connected between the positive terminal of the light emitting diode LD and the first electrical terminal E1, and the second electrode wire W2 is electrically connected between the negative terminal of the light emitting diode LD and the second electrical terminal E2. Accordingly, when the first electrical terminal E1 and the second electrical terminal E2 are electrically connected to electrical terminals of an external power supply source (not shown), the light emitting diode LD may generate the first light L1 using a power source provided from the power supply source.

The optical particles FP are distributed in the protective layer 20. Hereinafter, one optical particle of the optical particles FP will be described in detail as a representative example.

The optical particle FP includes the fluorescent substance FS and the core-shell particles CP disposed on a surface of the fluorescent substance FS. The fluorescent substance FS receives the first light L1 and generates a second light L2 having a wavelength different from that of the first light L1. In the present exemplary embodiment, a material for the fluorescent substance FS depends on the color of the first light L1 and the desired color of the exit light finally exiting from the LED package 100. For instance, when the color of the first light L1 is a blue color and the intended color of the exit light is a white color, the fluorescent substance FS may include yttrium aluminum garnet (YAG) fluorescent material. In this case, a portion of the first light L1 is absorbed by the YAG fluorescent material, and thus a yellow light L2 is emitted from the YAG fluorescent material. Thus, a remaining portion of the blue first light L1, which is not involved in the emission of the YAG fluorescent material, is mixed with the yellow light L2, so that the white light exits as the exit light.

The core-shell particles CP are disposed on the surface of the fluorescent substance FS. Hereinafter, one core-shell particle CP will be described in detail as a representative example.

The core-shell particle CP includes (FIG. 3) a metal particle MP and an insulating layer DL. The metal particle MP includes a metal material and has a particle shape. The metal material includes, for example, one of gold, white gold, silver, palladium, cadmium, cobalt, ruthenium, copper, indium, nickel, and iron or an alloy thereof.

The insulating layer DL transmits light, and a surface of the metal particle MP is coated with the insulating layer DL. In the present exemplary embodiment, the insulating layer DL includes at least one of, for example, nitride or oxide. For instance, the oxide includes at least one of, for example, titanium oxide, silicon oxide, magnesium oxide, aluminum oxide, or yttrium oxide, and the nitride includes at least one of, for example, silicon nitride or aluminum nitride.

Hereinafter, a function of the core-shell particle CP will be described in detail with reference to FIG. 4.

Figure 4:
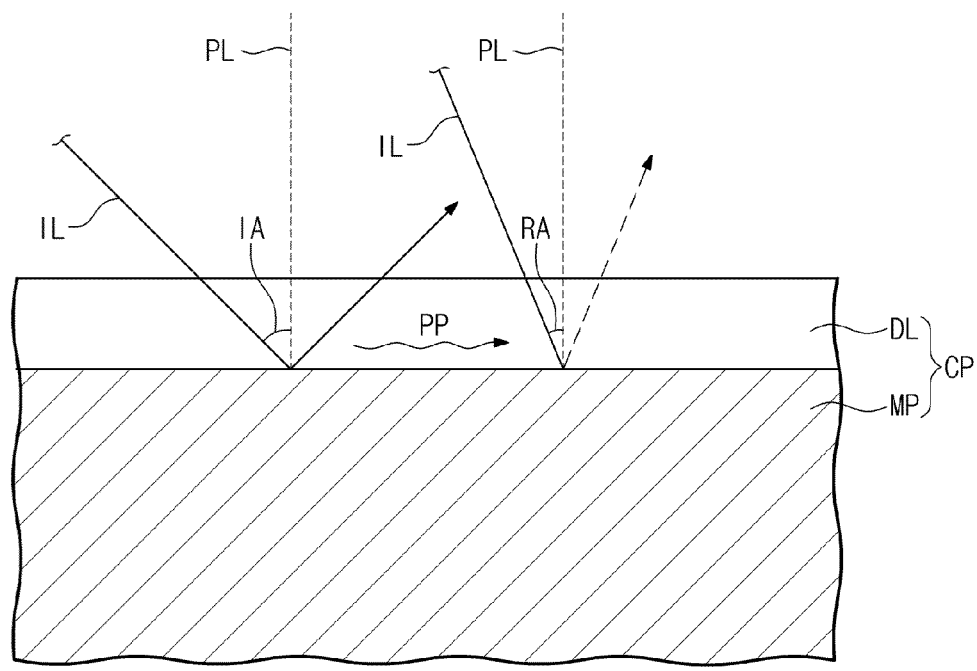
FIG. 4 is an enlarged view showing a surface of the core-shell particle shown in FIG. 3.

FIG. 4 is an enlarged view showing a surface of the core-shell particle shown in FIG. 3.

Referring to FIG. 4, when the surface of the metal particle MP is coated with the insulating layer DL, a surface plasmon, in which electrons collectively vibrate at the interface between the metal particle MP and the insulating layer DL, occurs. Due to the surface plasmon, an electromagnetic wave, e.g., a surface plasmon wave PP, is excited. Different from a conventional electromagnetic wave, the surface plasmon wave PP travels along the interface, i.e., a direction substantially in parallel to the interface between the metal particle MP and the insulating layer DL.

When at least one light component of the first light L1 or the second light L2 is incident to the metal particle MP after passing through the insulating layer DL, the light component is referred to as an incident light IL and an angle between a normal line PL vertical (perpendicular) to the surface of the metal particle MP and the incident light IL is referred to as an incident angle IA. In this case, a phase of the incident light IL may coincide with a phase of the surface plasmon wave PP at a specific value of the incident angle IA. When these phases coincide, the energy of the incident light IL is absorbed by the metal particle MP, and thus an electric field distribution is increased by an exponential function in a direction perpendicular to the interface between the metal particle MP and the insulating layer DL, but the electric field distribution is sharply decreased as it is closer to the inside of the metal particle MP. This is called a surface plasmon resonance, and the incident angle is called a surface plasmon resonance angle RA when the surface plasmon resonance occurs.

Thus, a localized electric field occurs on the surface of the metal particle MP by the surface plasmon resonance, and the localized electric field accelerates the rate of the recombination of excited electrons in the fluorescent substance FS. As a result of this increased recombination rate, light is emitted more frequently by the fluorescent substance FS. Consequently, the light emitting efficiency of the fluorescent substance FS may be improved by using the surface plasmon resonance.

According to the above, as the frequency that the incident angle IA satisfies the surface plasmon resonance angle RA is increased, the light emitting efficiency of the fluorescent substance FS may be improved by the surface plasmon resonance. In order to increase the frequency with which the incident angle IA satisfies the surface plasmon resonance angle RA, the first light L1 and the second light L2 are required to be scattered such that the first and second lights L1 and L2 arrive randomly during travelling. In the present exemplary embodiment, however, because the metal particle MP and the insulating layer DL have different dielectric constants, the incident light IL is totally reflected when the incident angle IA satisfies a critical angle condition. Accordingly, the metal particle MP scatters the first and second lights L1 and L2 by the total reflection, and thus the first and second lights L1 and L2 arrive randomly while travelling. This means that the light emitting efficiency of the fluorescent substance FS may be improved through the surface plasmon resonance by placing, or embedding, the core-shell particles CP, each having the metal particle MP, on the surface of the fluorescent substance FS.

In addition, because the core-shell particles CP are placed on the surface of the fluorescent substance FS, remaining light components of the second light L2 except for the light components of second light L2, involving in the surface plasmon resonance, passes through the metal particle MP. Accordingly, the second light L2 is more effectively scattered by the metal particle MP, so that the light emitting efficiency of the fluorescent substance FS may be improved by the surface plasmon resonance.

Further, because the core-shell particles CP are placed on the surface of the fluorescent substance FS, the fluorescent substance FS may be prevented from being directly exposed to external environments, e.g., moisture, temperature, etc. Therefore, deterioration of the fluorescent substance FS, which is caused by the external environment, may be reduced, and thus the light emitting function of the fluorescent substance FS, e.g., life-span, color purity, etc., may be improved.

Figure 5:
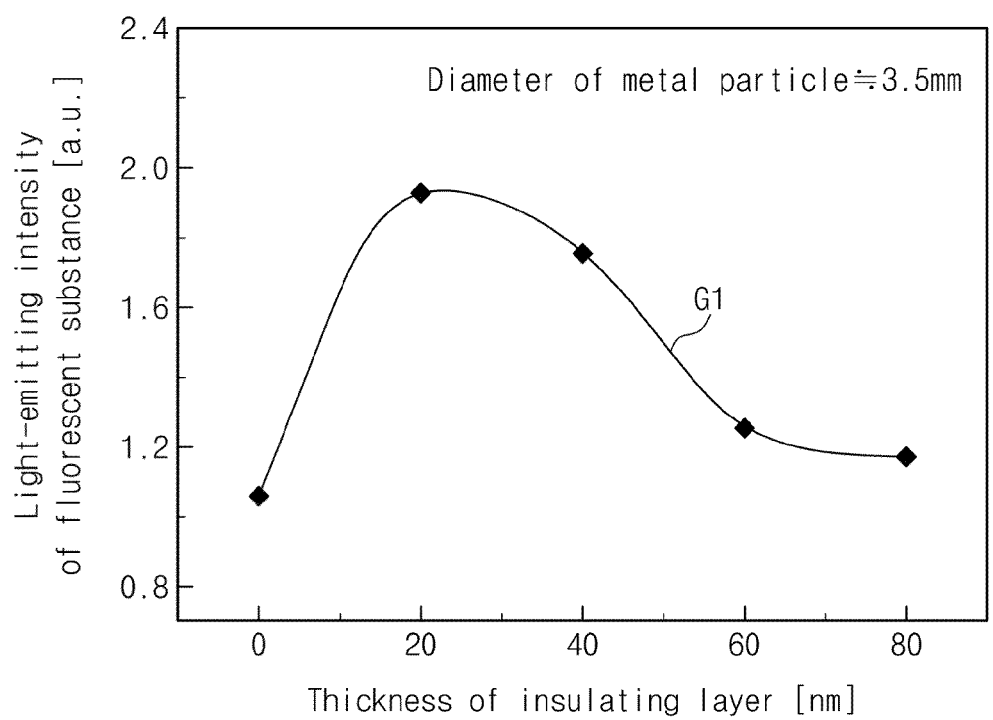
FIG. 5 is a graph showing the light emitting intensity of a fluorescent substance as a function of the thickness of an insulating layer according to an exemplary embodiment.

FIG. 5 is a graph showing light emitting intensity of the fluorescent substance as a function of the thickness of the insulating layer according to an exemplary embodiment.

Referring to FIGS. 3 and 5, a first graph G1 represents the light emitting intensity of the fluorescent substance FS as a function of the thickness of the insulating layer DL in arbitrary units in the case that the metal particle MP includes silver and has a diameter T1 of about 3.5 nanometers, and the insulating layer DL includes magnesium oxide.

According to the first graph G1, when the thickness of the insulating layer DL is zero, i.e., the insulating layer DL is omitted from the core-shell particle CP, the light emitting intensity of the fluorescent substance FS is about 1.05. In addition, when the insulating layer DL has the thickness T2 of about 1 nanometer to about 20 nanometers, the light emitting intensity of the fluorescent substance FS is increased to about 1.90 from about 1.05, and the light emitting intensity of the fluorescent substance FS is decreased to about 1.2 from about 1.90 when the insulating layer DL has the thickness T2 of about 20 nanometers to about 80 nanometers. Accordingly, because the light emitting intensity of the fluorescent substance FS when the thickness T2 of the insulating layer DL is in a range of about 1 nanometer to about 80 nanometers is greater than the light emitting intensity of the fluorescent substance FS when the thickness T2 of the insulating layer DL is zero, the light emitting intensity or the light emitting efficiency of the fluorescent substance FS may be improved when the thickness T2 of the insulating layer DL is in the range of about 1 nanometer to about 80 nanometers.

In addition, although not shown in FIG. 5, when the metal particle MP has the diameter T1 of about 1 nanometer to about 30 nanometers, the light emitting intensity of the fluorescent substance FS when the thickness T2 of the insulating layer DL is in the range of about 1 nanometer to about 80 nanometers is greater than the light emitting intensity of the fluorescent substance FS when the thickness T2 of the insulating layer DL is zero, which is similar to the first graph G1. Thus, the diameter T1 of the metal particle MP may be in a range of about 1 nanometer to about 30 nanometers.

Figure 6:
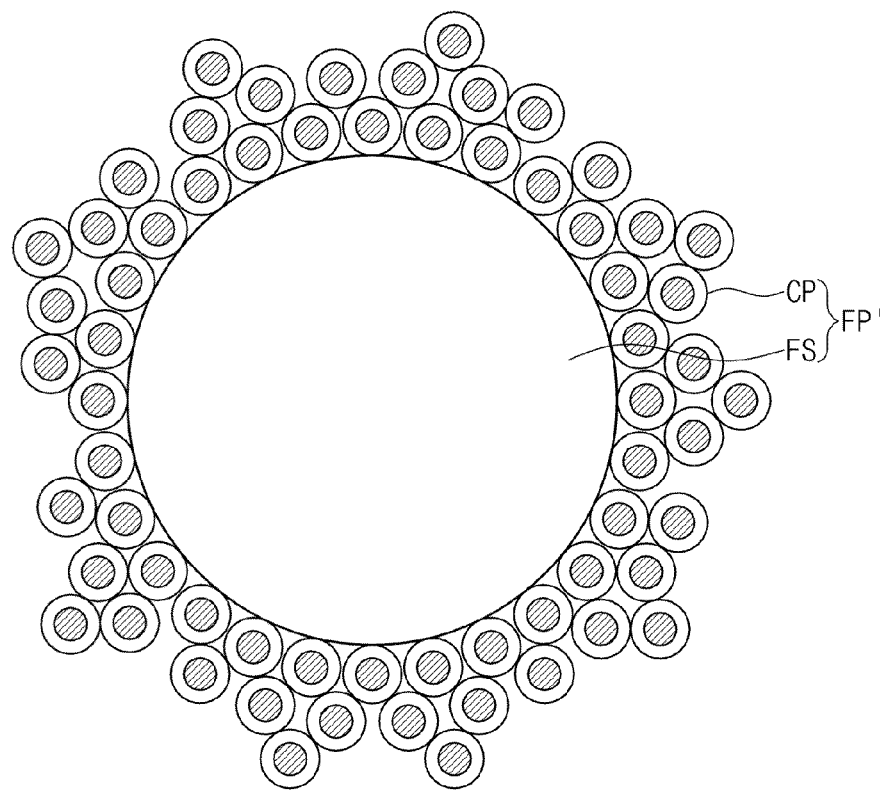
FIG. 6 is a cross-sectional view showing optical particles according to another exemplary embodiment.

FIG. 6 is a cross-sectional view showing optical particles according to another exemplary embodiment. In FIG. 6, the same reference numerals denote the same elements in FIG. 2, and thus repetitive descriptions of the same elements will be omitted.

FIG. 6 shows one optical particle FP' of a plurality of optical particles distributed in the protective layer 20 (refer to FIG. 1) of the LED package 100 (refer to FIG. 1). The optical particle FP' includes a fluorescent substance FS and a plurality of core-shell particles CP disposed on a surface of the fluorescent substance FS.

Different from the exemplary embodiment shown in FIG. 2, the core-shell particles CP are coated on the surface of the fluorescent substance FS as shown in FIG. 6. In this case, the core-shell particles CP may be stacked on the surface of the fluorescent substance FS in multiple layers so as to coat the core-shell particles CP on the surface of the fluorescent substance FS.

As described above, in the case that the core-shell particles CP are coated on the surface of the fluorescent substance FS, the first light L1 and the second light L2 are more effectively scattered by the core-shell particles CP, so that the light emitting efficiency of the fluorescent substance FS may be improved by the surface plasmon resonance. In addition, because the surface of the fluorescent substance FS is not exposed to the external environment, the fluorescent substance FS may be prevented from being deteriorated by the external environment.

Figure 7:
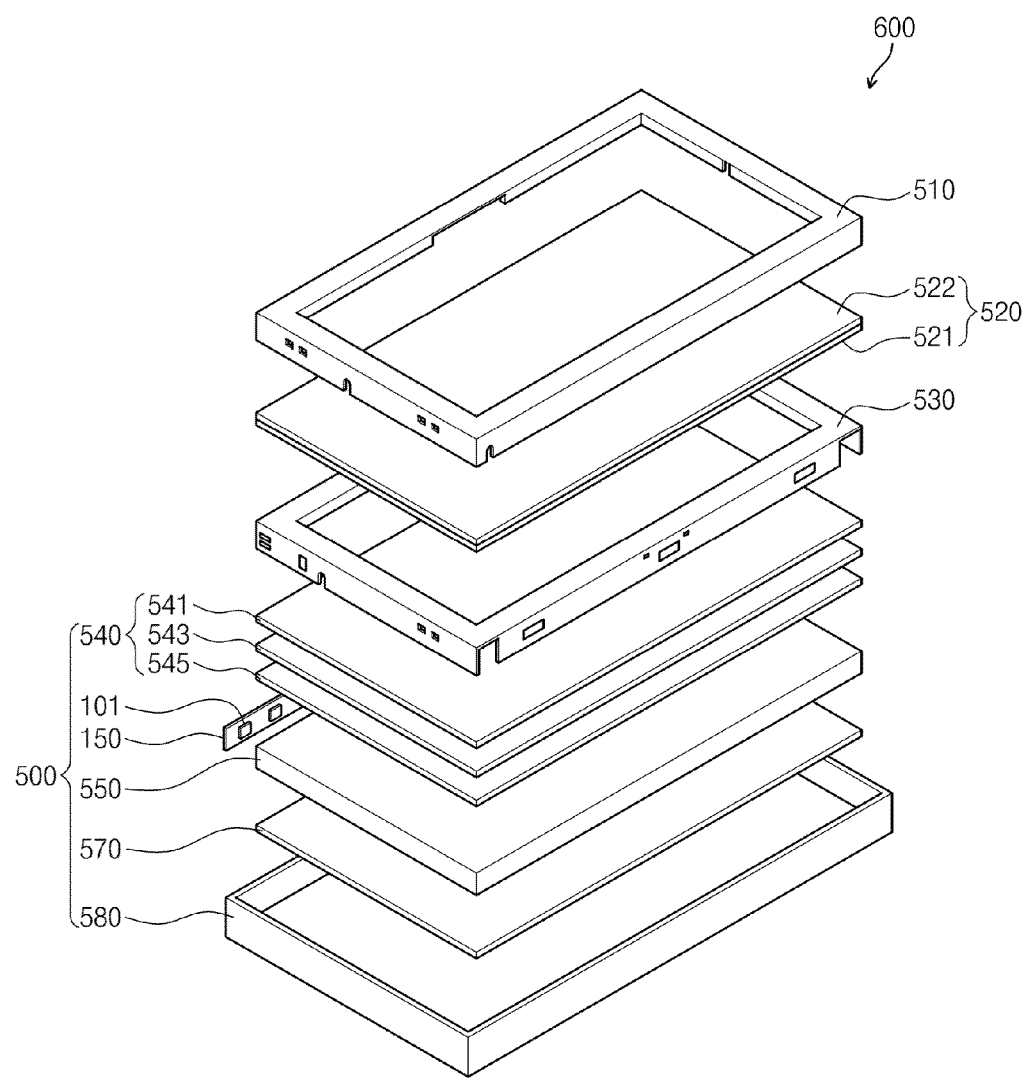
FIG. 7 is an exploded perspective view showing a liquid crystal display according to another exemplary embodiment.

FIG. 7 is an exploded perspective view showing a liquid crystal display according to another exemplary embodiment of the present invention.

Referring to FIG. 7, a display apparatus 600 includes a backlight assembly 500 and a display panel 520. The backlight assembly 500 generates light and the display panel 520 displays an image using the light.

The backlight assembly 500 includes a plurality of LED packages 101, a printed circuit board 150, a receiving container 580, a reflecting plate 570, a light guide plate 550, a plurality of sheets 540, a mold frame 530, and a cover member 510.

The LED packages 101 generate the light used to display the image on the display panel 520. Each of the LED packages 101 have the same structure and function as those of the LED package 100 described with reference to FIG. 1, and thus detailed descriptions of the LED packages 101 will be omitted.

The printed circuit board 150 is electrically connected to the LED packages 101, so that the power source is applied to the LED packages 101 through the printed circuit board 150. In the present exemplary embodiment, the printed circuit board 150 on which the LED packages 101 are mounted is disposed so as to face a side portion of the light guide plate 550.

The receiving container 580 includes a bottom portion and a plurality of sidewalls extended from the bottom portion to accommodate the backlight assembly 500. In the present exemplary embodiment, the receiving container 580 is formed of a metal material so as to easily discharge heat generated in the LED packages 101.

The light guide plate 550 is accommodated in the receiving container 580 such that a side portion thereof faces the LED packages 101. Accordingly, the light emitting surface ES (refer to FIG. 1) of each of the LED packages 101 faces the side portion of the light guide plate 550, so that the light exiting from the light emitting surface is incident into the light guide plate 550 through the side portion of the light guide plate 550. In addition, the light incident into the light guide plate 550 is guided by a light guide pattern (not shown) formed in the light guide plate 550 and is then provided to the display panel 520.

The reflecting plate 570 includes a light reflecting material, such as, for example, polyethylene terephthalate (PET), aluminum, etc., and is disposed between the bottom portion of the receiving container 580 and the light guide plate 550. Thus, light that is generated by the LED packages 101 that is not initially directed to the light guide plate 550, is reflected by the reflecting plate 570 and is then incident into the light guide plate 550.

The mold frame 530 is coupled to the receiving container 580 to affix an end portion of the light guide plate 550 to the receiving container 580. A portion of the mold frame 530 is extended substantially in parallel to the bottom portion of the receiving container 580, and thus the sheets 540 and the display panel 520 are mounted on the mold frame 530.

The sheets 540 are disposed on the display panel 520. The sheets 540 include optical sheets that control an optical path of the light exiting from the light guide plate 550 and traveling to the display panel 520 and a protective sheet that protects the surface of the display panel 520. In the present exemplary embodiment, the sheets 540 include a protective sheet 541 that protects a rear surface of the display panel 520, a prism sheet 543 that improves front brightness of the display panel 520, and a diffusion sheet 545 that diffuses the light.

The display panel 520 receives the light generated from the backlight assembly 500 and displays the image. The display panel 520 may be, but is not limited to, a liquid crystal display panel. In this case, the display panel 520 includes a first substrate 521 that includes a plurality of pixel electrodes, a second substrate 522 that includes a common electrode, and a liquid crystal layer (not shown) disposed between the first substrate 521 and the second substrate 522.

The cover member 510 is partially opened to expose a display area of the display panel 520. The cover member 510 is coupled to the receiving container 580 to cover an end portion of the display panel 520. When the cover member 510 is coupled to the receiving container 580, parts of the backlight assembly 500 may be stably accommodated in the receiving container 580.

Figure 8:
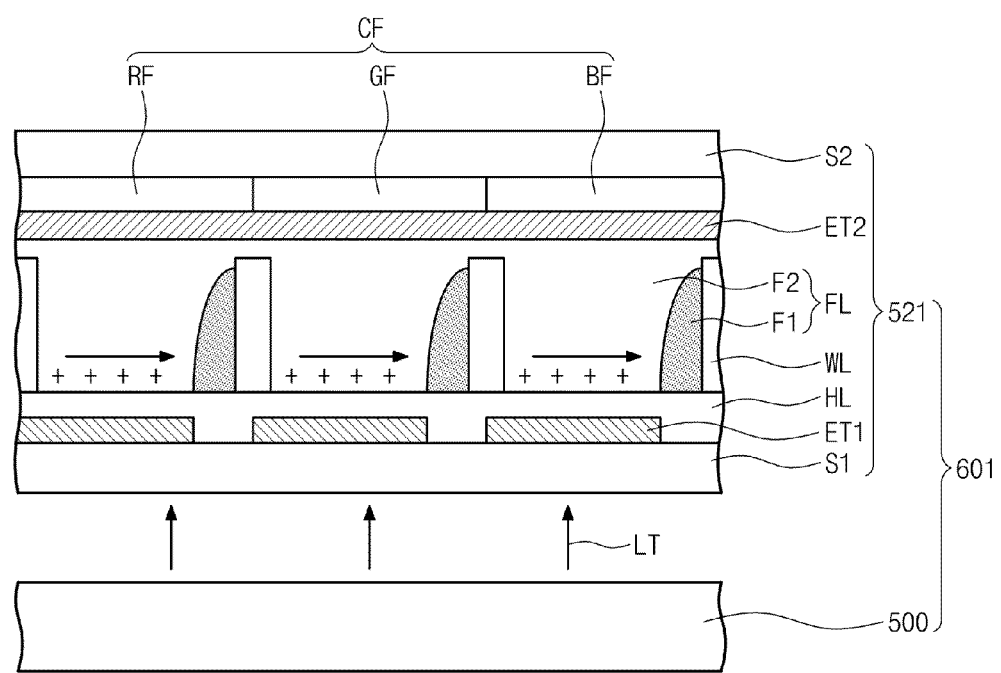
FIG. 8 is a cross-sectional view showing a display apparatus according to another exemplary embodiment.

FIG. 8 is a cross-sectional view showing a display apparatus according to another exemplary embodiment. In FIG. 8, the display apparatus 601 includes the backlight assembly 500 described with reference to FIG. 7, and thus repetitive description of the backlight assembly 500 will be omitted.

Referring to FIG. 8, the display apparatus 601 includes a backlight assembly 500 and a display panel 521. The display panel 521 may be, for example, an electrowetting display panel. The display panel 521 displays the image using a light LT provided from the backlight assembly 500.

The display panel 521 includes a first substrate S1, a second substrate S2, a plurality of barrier walls WL, an electrowetting layer FL, a first electrode ET1, a second electrode ET2, a hydrophobic layer HL, and a plurality of color filters CF. The first substrate S1 and the second substrate S2 are disposed to face each other, and are formed of an insulating material having the same light transmittance as that of a glass substrate. The barrier walls WL are disposed on the first substrate S1 to define a plurality of pixel areas. The pixel areas correspond to areas in which the color filters CF are arranged, in a one-to-one correspondence.

In the present exemplary embodiment, the color filters CF are disposed on the second substrate S2 and include a red filter RF, a green filter CF, and a blue filter BF. The color filters CF filter the light LT generated by the backlight assembly 500 and passing through the electrowetting layer FL to give the light LT a specific color.

The first electrode ET1 is disposed on the first substrate S1 and the second electrode ET2 is disposed on the second substrate S2 to face the first electrode ET1. Accordingly, an electric field is formed between the first electrode ET1 and the second electrode ET2, thereby controlling a movement of a first fluid F1 and a second fluid F2 in the electrowetting layer FL.

The hydrophobic layer HL covers the first electrode ET1 and makes contact with the electrowetting layer FL. Due to presence of the hydrophobic layer HL, wettability between the hydrophobic fluid component of the electrowetting layer FL and the hydrophobic layer HL may be improved.

The electrowetting layer FL includes the first fluid F1 and the second fluid F2, which are not mixed with each other. The first fluid F1 may be black oil having an electrical non-conductivity, e.g., an alkane such as hexadecane, an oil such as silicon oil, etc. In addition, the second fluid F2 has an electrical conductivity or polarity, and includes a mixture of water and ethyl alcohol, in which potassium chloride is dissolved, or aqueous sodium chloride solution (AQ). Further, the second fluid F2 may be transparent.

Thus, when an attractive force occurs between the second fluid F2 and the first electrode ET1 due to an electric field generated between the first electrode ET1 and the second electrode ET2, the second fluid F2 moves toward the first electrode ET1 in the electrowetting layer FL. As a result, the first fluid F1 is displaced out to an end portion of each pixel area by the second fluid F2. Due to the movement of the first fluid F1 and the second fluid F2 in the electrowetting layer FL, the light LT generated by the backlight assembly 500 and passing through the electrowetting layer FL is dimmed to generate a grey-scale image, and subsequently filtered to have a specific color by the color filters CF. Consequently, the display panel 521 displays the image using the color light exiting from the color filters CF.

Although the exemplary embodiments have been described, it is understood that the present invention should not be limited to these exemplary embodiments but various changes and modifications can be made by one ordinary skilled in the art within the spirit and scope of the present disclosure, including the following claims.

What is claimed is:

1. A light emitting diode package comprising:
a light emitting diode that emits a first light;
a fluorescent substance that absorbs the first light and generates a second light having a wavelength different from the first light; and
at least one core-shell particle disposed on a surface of the fluorescent substance, the core-shell particle comprising:
a metal particle; and
an insulating layer coated on a surface of the metal particle,
wherein the core-shell particle receives at least one component of the first light and the second light to induce a surface plasmon resonance.

2. The light emitting diode package of claim 1, wherein the core-shell particle is provided on the surface of the fluorescent substance in a plural number and the surface of the fluorescent substance is covered by the core-shell particles.

3. The light emitting diode package of claim 1, wherein other light components except for the at least one light component are scattered at the surface of the metal particle and the scattered light components are provided to core-shell particles adjacent to the core-shell particle to increase a frequency in which the surface plasmon resonance occurs.

4. The light emitting diode package of claim 1, wherein the insulating layer transmits light.

5. The light emitting diode package of claim 4, wherein the insulating layer comprises at least one of nitride and oxide.

6. The light emitting diode package of claim 5, wherein the oxide comprises at least one of titanium oxide, silicon oxide, magnesium oxide, aluminum oxide, and yttrium oxide, and the nitride comprises at least one of silicon nitride and aluminum nitride.

7. The light emitting diode package of claim 1, wherein the metal particle comprises at least one of gold, white gold, silver, palladium, cadmium, cobalt, ruthenium, copper, indium, nickel, iron, and an alloy thereof.

8. The light emitting diode package of claim 1, wherein the metal particle has a diameter of about 1 nanometer to about 30 nanometers.

9. The light emitting diode package of claim 1, wherein the insulating layer has a thickness of about 5 nanometers to about 80 nanometers.

10. A display apparatus comprising:
a display panel that receives a light to display an image; and
a light emitting diode package that generates the light, the light comprising:
a first light generated by the light emitting diode package; and
a second light generated by the light emitting diode package, wherein the light emitting diode package comprises:
a light emitting diode that generates the first light;
a fluorescent substance that absorbs the first light and generates the second light having a wavelength different from the first light; and
at least one core-shell particle disposed on a surface of the fluorescent substance, and the core-shell particle comprises:
a metal particle; and
an insulating layer coated on a surface of the metal particle,
wherein the core-shell particle receives at least one light component of the first light and the second light to induce a surface plasmon resonance.

11. The display apparatus of claim 10, wherein the core-shell particle is provided on the surface of the fluorescent substance in a plural number and the surface of the fluorescent substance is covered by the core-shell particles.

12. The display apparatus of claim 10, wherein other light components except for the at least one light component are scattered at the surface of the metal particle and the scattered light components are provided to core-shell particles adjacent to the core-shell particle to increase a frequency in which the surface plasmon resonance occurs.

13. The display apparatus of claim 10, wherein the insulating layer transmits light.

14. The display apparatus of claim 13, wherein the insulating layer comprises at least one of nitride and oxide.

15. The display apparatus of claim 14, wherein the oxide comprises at least one of titanium oxide, silicon oxide, magnesium oxide, aluminum oxide, and yttrium oxide, and the nitride comprises at least one of silicon nitride and aluminum nitride.

16. The display apparatus of claim 10, wherein the metal particle comprises one of gold, white gold, silver, palladium, cadmium, cobalt, ruthenium, copper, indium, nickel, iron, and an alloy thereof.

17. The display apparatus of claim 10, wherein the metal particle has a diameter of about 1 nanometer to about 30 nanometers.

18. The display apparatus of claim 10, wherein the insulating layer has a thickness of about 5 nanometers to about 80 nanometers.

19. The display apparatus of claim 10, wherein the display panel is a liquid crystal display panel.

20. The display apparatus of claim 10, wherein the display panel is an electrowetting display panel.

* * * * *